(12) United States Patent
Sakashita et al.

(10) Patent No.: US 9,030,245 B2
(45) Date of Patent: May 12, 2015

(54) SEMICONDUCTOR DEVICE THAT CAN ADJUST PROPAGATION TIME OF INTERNAL CLOCK SIGNAL

(71) Applicant: PS4 Luxco S.A.R.L., Luxembourg (LU)

(72) Inventors: Mototada Sakashita, Tokyo (JP); Satoshi Morishita, Tokyo (JP); Yoshinori Matsui, Tokyo (JP); Yasushi Matsubara, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 13/723,975

(22) Filed: Dec. 21, 2012

(65) Prior Publication Data

US 2013/0162308 A1    Jun. 27, 2013

(30) Foreign Application Priority Data

Dec. 22, 2011 (JP) ................. 2011-281802

(51) Int. Cl.
*H03H 11/26* (2006.01)
*H03K 5/159* (2006.01)
*H03K 21/00* (2006.01)
*G06F 1/10* (2006.01)
*H03K 21/40* (2006.01)

(52) U.S. Cl.
CPC ............ *H03K 5/159* (2013.01); *H03K 21/00* (2013.01); *G06F 1/10* (2013.01); *H03K 21/406* (2013.01); *H01L 2224/32145* (2013.01); *H01L 2224/48091* (2013.01); *H01L 2224/73265* (2013.01); *H01L 2924/15311* (2013.01)

(58) Field of Classification Search
USPC ......... 327/153, 161, 231, 237, 243, 261, 276, 327/277, 284; 365/193, 194, 233.1; 710/58, 710/61; 713/500–503
See application file for complete search history.

(56) References Cited

U.S. PATENT DOCUMENTS

| | | | | |
|---|---|---|---|---|
| 7,430,143 B2 * | 9/2008 | Choi | ............................. | 365/194 |
| 7,436,230 B2 * | 10/2008 | Kim | ............................. | 327/158 |
| 8,780,653 B2 * | 7/2014 | Ito et al. | ........................ | 365/193 |
| 2013/0155792 A1 * | 6/2013 | Matsui | ........................ | 365/193 |

FOREIGN PATENT DOCUMENTS

JP        10-214483 A    8/1998

* cited by examiner

*Primary Examiner* — Patrick O'Neill

(57) ABSTRACT

Disclosed herein is a semiconductor device that includes: a measurement circuit which measures propagation time of an internal clock signal; a delay adjustment circuit which adjusts the propagation time of the internal clock signal on the basis of a result of measurement by the measurement circuit; and a data output circuit which outputs a data signal in synchronization with the internal clock signal.

18 Claims, 17 Drawing Sheets

SEMICONDUCTOR DEVICE THAT CAN ADJUST PROPAGATION TIME OF INTERNAL CLOCK SIGNAL

BACKGROUND OF THE INVENTION

1. Field of the Invention The present invention relates to a semiconductor device, and particularly to a semiconductor device able to adjust propagation time of an internal clock signal.

2. Description of Related Art

A DRAM (Dynamic Random Access Memory), which is one of typical semiconductor memory devices, generally has a DLL (Delay Locked Loop) circuit to accurately transfer data at high speed between the DRAM and a memory controller. The DLL circuit generates an internal clock signal that is phase-controlled with respect to an external clock signal supplied from the memory controller. The internal clock signal is used as a timing signal to output read data. Therefore, it is possible to accurately transfer data between the DRAM and the memory controller at high speed.

However, the DLL circuit consumes a relatively large amount of power. In a semiconductor memory device that is required to have low power consumption particularly for use in mobile devices, the DLL circuit may not be provided. In such a semiconductor memory device, the outputting of read data takes place in synchronism with an internal clock signal that is not phase-controlled. Therefore, an output timing of read data is not in synchronism with the external clock signal. More specifically, after a predetermined delay time has passed since a corresponding active edge of the external clock signal, the outputting of read data starts. The delay time is generally referred to as "tAC" (See Japanese Patent Application Laid-Open No. 10-214483).

For the value of delay time tAC, a predetermined allowable range has been set depending on specifications. Therefore, even when there are variations in delay time tAC between a plurality of semiconductor memory devices produced, the semiconductor memory devices can be shipped as non-defective products if the variations are within the allowable range.

However, the problem is that, if the delay time tAC varies, a selection test process after packaging becomes complex. The reason is that, in order to perform the selection tests in parallel for a plurality of semiconductor memory devices that are different in delay time tAC, adjustments need to be made to the output timing of a data strobe signal of each semiconductor memory device. Accordingly, for example, it is desirable that, before the selection tests are conducted, the delay time tAC be measured on a semiconductor wafer; and that, on the basis of the measurement results, the propagation time of the internal clock signal be adjusted in order to reduce variations in delay time tAC. However, it is difficult to use a high-speed tester for a test that is conducted on the semiconductor wafer; a tester whose operating speed is slow is generally used. The problem is that the delay time tAC cannot be measured accurately with such a tester. The problem can arise not only with semiconductor memory devices such as DRAM, but also with all semiconductor devices that output data in synchronization with an internal clock signal that is not phase-controlled.

SUMMARY

In one embodiment, there is provided a semiconductor device that includes: a measurement circuit measuring propagation time of an internal clock signal inside the semiconductor device; a delay adjustment circuit adjusting the propagation time of the internal clock signal; and a data output circuit outputting a data signal in response to the internal clock signal.

In another embodiment, there is provided a semiconductor device that includes: first to third external terminals; a clock input circuit generating an internal clock signal based on an external clock signal supplied from the first external terminal; a data output circuit outputting a data signal to the second external terminal in response to the internal clock signal; a delay adjustment circuit provided on a propagation path of the internal clock signal between the clock input circuit and the data output circuit, the delay adjustment circuit adjusting a propagation time of the internal clock signal; and a replica circuit receiving a test signal supplied from the third external terminal. A first time from when the test signal is supplied to the replica circuit until when the test signal is output from the replica circuit is proportional to a second time from when the external clock signal is supplied to the first external terminal until the external clock signal reaches the data output circuit.

In still another embodiment, there is provided a semiconductor device that includes: a frequency dividing circuit configured to divide a first clock signal to generate a plurality of second clock signals that are different in phase from one another; a multiplier circuit configured to multiply the second clock signals to generate a third clock signal; a delay adjustment circuit configured to select a delay amount of the third clock signal based on a delay code to generate a fourth clock signal; and a data output circuit outputting a data signal in response to the fourth clock signal.

According to the present invention, propagation time of the internal clock signal can be accurately measured even if a low-speed tester is used. Therefore, the delay time tAC can be adjusted, for example, on a semiconductor wafer

DETAILED DESCRIPTION OF THE EMBODIMENTS

Preferred embodiments of the present invention will be explained below in detail with reference to the accompanying drawings.

Figure 1:
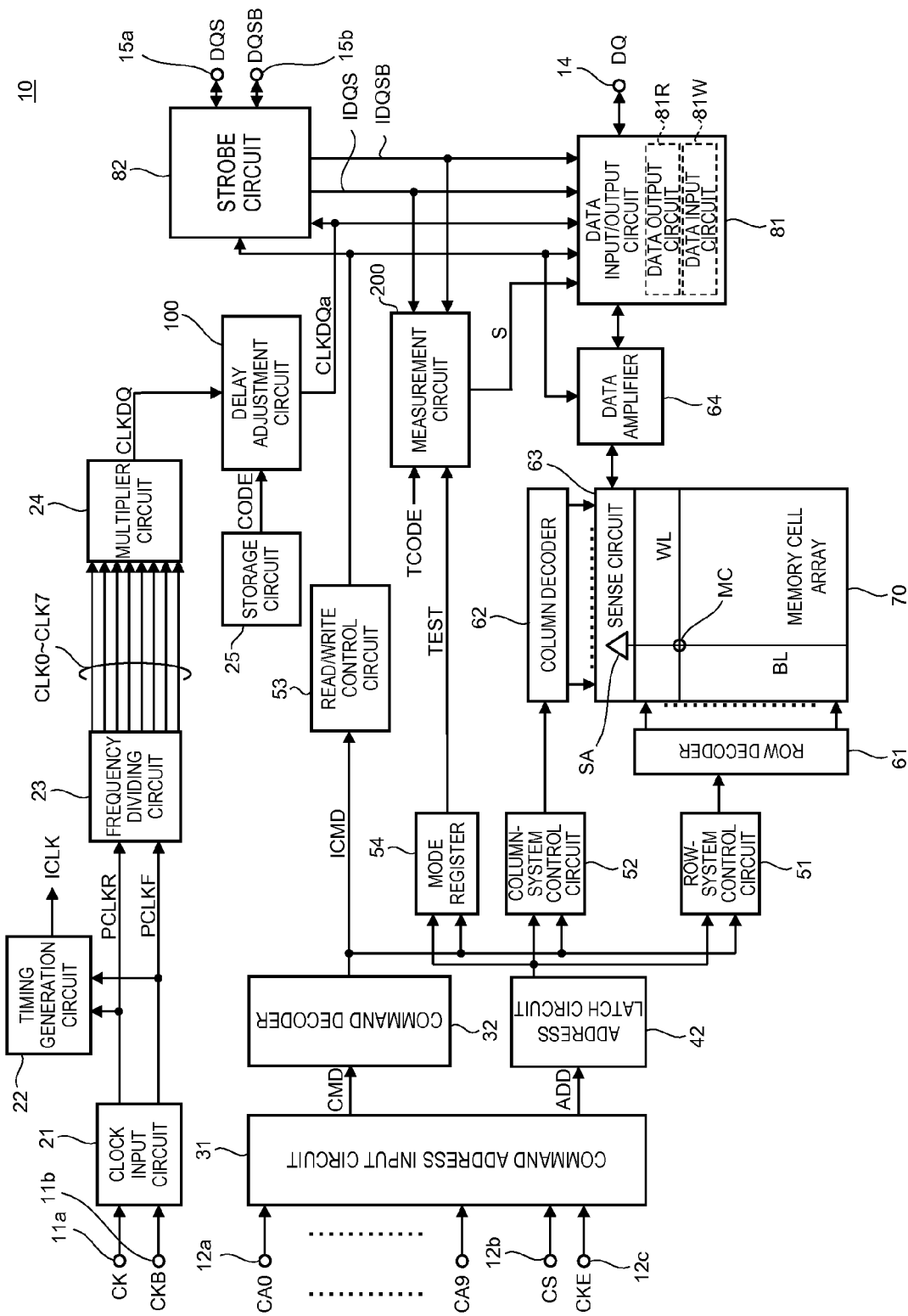
FIG. 1 is a block diagram indicative of a configuration of a semiconductor device according to a preferred first embodiment of the present invention.

Referring now to FIG. 1, the semiconductor device 10 according to the first embodiment is a DRAM and has external terminals that include clock terminals 11a and 11b, command address terminals 12a, a chip selection terminal 12b, a clock enable terminal 12c, a data input/output terminal 14, and data strobe terminals 15a and 15b. While the semiconductor device 10 also includes a power source terminal or the like, these elements are not shown in FIG. 1.

The clock terminals 11a and 11b are supplied with external clock signals CK and CKB, respectively. The external clock signals CK and CKB are transferred to a clock input circuit 21. In the present specification, a signal whose name ends with "B" is an inverted signal of a corresponding signal or low-active signal. Accordingly, the external clock signals CK and CKB are complementary to each other.

The internal clock signals PCLKR and PCLKF that are output from the clock input circuit 21 are supplied to a timing generation circuit 22 and the frequency dividing circuit 23. The timing generation circuit 22 generates various internal clocks ICLK, and supplies the internal clocks ICLK to various internal circuits. The frequency dividing circuit 23 divides the frequency of the internal clock signals PCLKR and PCLKF to generate eight frequency-divided clock signals CLK0 to CLK7 that are different in phase from one another. The frequency of the frequency-divided clock signals CLK0 to CLK7 is one-quarter of the frequency of the external clock signal CK. The phase difference therebetween is one-quarter of a clock cycle of the internal clock signals PCLKR and PCLKF. According to the present embodiment, the frequency dividing circuit 23 is used to generate eight phases of frequency-divided clock signals. However, the present invention is not limited to eight phases of frequency-divided clock signals. For example, the frequency dividing circuit 23 may be used to generate four phases of frequency-divided clock signals. The frequency-divided clock signals C CLK0 to CLK7 are supplied to the multiplier circuit 24.

The multiplier circuit 24 generates the internal clock signal CLKDQ by multiplying the frequency-divided clock signals CLK0 to CLK7. The frequency of the internal clock signal CLKDQ generated by the multiplier circuit 24 is equal to the frequency of the external clock signal CK. That is, the multiplier circuit 24 multiplies the frequency-divided clock signals CLK0 to CLK7, whose frequency has been divided by the frequency dividing circuit 23 so as to be one-quater of the frequency of the external clock signal CK, to regenerate the internal clock signal CLKDQ, the frequency of which is equal to the frequency of the external clock signal CK. The internal clock signal CLKDQ is supplied to a delay adjustment circuit 100.

The delay adjustment circuit 100 receives and delays an internal clock signal CLKDQ to generate an internal clock signal CLKDQa. The amount of adjustments by the delay adjustment circuit 100 is determined based on a delay code CODE read from a storage circuit 25. The storage circuit 25 includes a nonvolatile storage element to which the delay code CODE can be written, such as an optical fuse element or an electrical fuse element. Although not specifically restricted, it is preferred that the storage circuit 25 contain a nonvolatile storage element such as an electrical fuse element to which the delay code CODE can be electrically written. The electrical fuse element may be an anti-fuse element in which data are stored by insulation breakdown caused by high voltage applied. The internal clock signal CLKDQa output from the delay adjustment circuit 100 is supplied to a data input/output circuit 81 and a strobe circuit 82. The configuration of the delay adjustment circuit 100 will be described later.

The command address terminals 12a are supplied with command address signals CA0 to CA9 that constitute the command signal CMD and the address signal ADD. The chip selection terminal 12b is a supplied with a chip selection signal CS. The clock enable terminal 12c is supplied with a clock enable signal CKE. These signals CA0 to CA9, CS and CKE are supplied to a command address input circuit 31. Among these signals supplied to the command address input circuit 31, the command signal CMD, the chip selection signal CS, and the clock enable signal CKE are supplied to a command decoder 32, and the address signal ADD is supplied to an address latch circuit 42.

The command decoder 32 generates various internal commands ICMD by performing a process of retaining, decoding, and counting command signals in synchronization with the internal clock signal ICLK. The internal commands ICMD are supplied to a row system control circuit 51, a column system control circuit 52, a read/write control circuit 53, and a mode register 54.

The address latch circuit 42 latches the address signal ADD in synchronization with the internal clock signal ICLK. Out of the address signals ADD latched by the address latch circuit 42, a row address is supplied to the row-system control circuit 51, and a column address is supplied to the column-system control circuit 52. During an entry to a mode register set operation, the address signal ADD is supplied to the mode register 54, thereby the content of the mode register 54 is overwritten.

An output signal of the row-system control circuit 51 is supplied to a row decoder 61. The row decoder 61 selects any of word lines WL included in a memory cell array 70. Within the memory cell array 70, plural word lines WL and plural bit lines BL cross each other, and memory cells MC are arranged at intersections of these word lines and bit lines (FIG. 1 shows only one word line WL, one bit line BL, and one memory cell MC). The bit lines BL are connected to corresponding sense amplifiers SA included in a sense circuit 63.

An output signal of the column-system control circuit 52 is supplied to the column decoder 62. The column decoder 62 selects any of sense amplifiers SA in the sense circuit 63. The sense amplifier SA selected by the column decoder 62 is connected to a data amplifier 64. In a read operation, the data amplifier 64 further amplifies read data amplified by the sense circuit 63, and supplies the amplified read data to the data input/output circuit 81. On the other hand, in a write operation, the data amplifier 64 amplifies write data received from the data input/output circuit 81, and supplies the amplified write data to the sense circuit 63. The read/write control circuit 53 controls the data amplifier 64 and the data input/output circuit 81.

The data input/output terminal 14 is a terminal for outputting the read data DQ and inputting the write data DQ. The data input/output terminal 14 is connected to the data input/output circuit 81. The data input/output circuit 81 includes a data output circuit 81R and a data input circuit 81W. The data output circuit 81R outputs, during a reading operation, the read data DQ in synchronization with the internal clock signal CLKDQa. The data input circuit 81W accepts, during a writing operation, the write data DQ in synchronization with the internal data strobe signals IDQS and IDQSB. The semiconductor device 10 of the present embodiment does not include a DLL circuit. Therefore, the internal clock signal CLKDQa is not in synchronization with the external clock signals CK and CKB. Accordingly, the read data DQ are output in such a way as to be out of synchronization with the external clock signals CK and CKB.

The data strobe terminals 15a and 15b are terminals for inputting and outputting the external data strobe signals DQS and DQSB, and are connected to a strobe circuit 82. The strobe circuit 82 outputs, during a reading operation, the external data strobe signals DQS and DQSB in synchronization with the read data DQ. During a writing operation, the strobe circuit 82 generates the internal data strobe signals IDQS and IDQSB on the basis of the external data strobe signals DQS and DQSB.

The internal data strobe signals IDQS and IDQSB output from the strobe circuit 82 are also supplied to a measurement circuit 200. The measurement circuit 200 is a replica circuit that is designed to monitor propagation time, which is the time required for a corresponding active edge of the internal clock signal CLKDQa to reach the data input/output circuit 81 after the external clock signals CK and CKB are input to the clock terminals 11a and 11b. The result S of measurement by the measurement circuit 200 is output to outside via the data input/output circuit 81 and the data input/output terminal 14.

Figure 2:
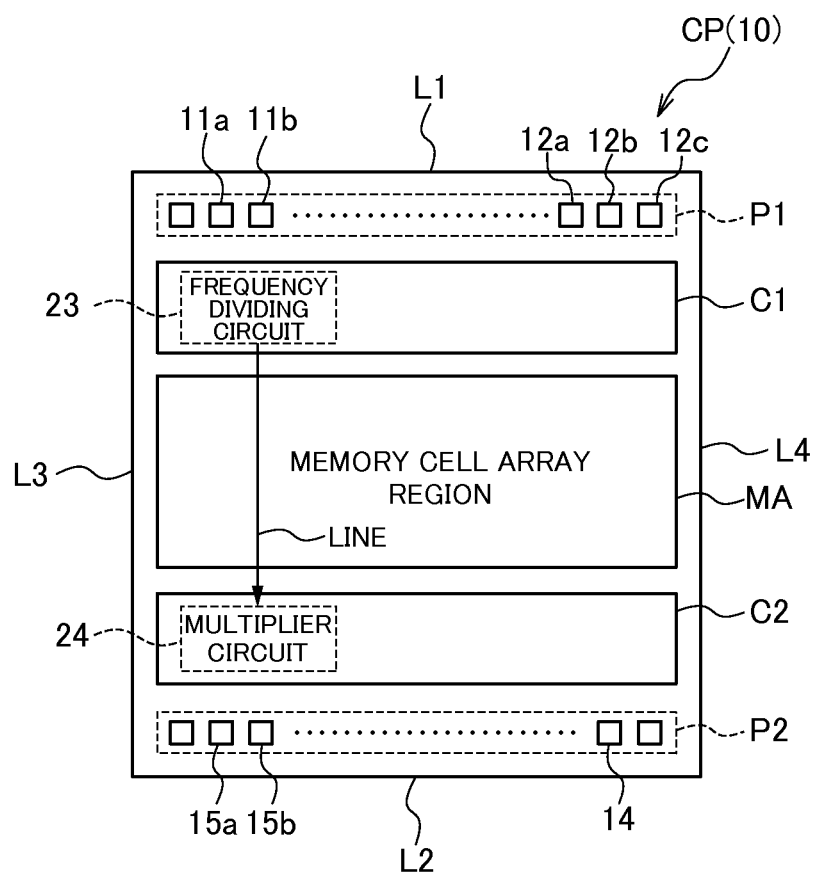
FIG. 2 is a plane view indicative of a layout of the semiconductor device shown in FIG. 1.

Turning to FIG. 2, the semiconductor device 10 according to the present embodiment is integrated on one silicon chip CP. A principal surface of the silicon chip CP is in a square shape, and has first and second sides L1 and L2 that are elongated in parallel to each other, and third and fourth sides L3 and L4 that are perpendicular to the sides L1 and L2 and elongated in parallel to each other. The semiconductor device 10 of the present embodiment includes a first pad region P1, which is provided along the first side L1, and a second pad region P2, which is provided along the second side L2. There are no pad regions along the third and fourth sides L3 and L4. The first and second pad regions P1 and P2 are regions where a plurality of external terminals are arranged. In the first pad region P1, the clock terminals 11a and 11b, the command address terminals 12a, the chip select terminal 12b, the clock enable terminal 12c, and the like are arranged. In the second pad region P2, the data input/output terminal 14, the data strobe terminals 15a and 15b, and the like are arranged.

The semiconductor device 10 of the present embodiment also includes a first peripheral circuit region C1 provided along the first pad region P1, a second peripheral circuit region C2 provided along the second pad region P2, and a memory cell array region MA sandwiched between the first and second peripheral circuit regions C1 and C2. In the first peripheral circuit region C1, peripheral circuits related to the external terminals arranged in the first pad region P1 are disposed. In the second peripheral circuit region C2, peripheral circuits related to the external terminals arranged in the second pad region P2 are disposed. For example, in the first peripheral circuit region C1, the clock input circuit 21, the frequency dividing circuit 23, and the like are disposed. In the second peripheral circuit region C2, the multiplier circuit 24, the data input/output circuit 81, the data strobe circuit 82, and the like are disposed.

Given the layout described above, if the internal clock signals PCLKR and PCLKF are supplied directly to the second peripheral circuit region C2, the dullness of the waveform increases due to a relatively large parasitic capacitance of a long-distance clock line. The problem can be solved by several relay buffers that are interposed along the clock line. However, in this case, the problem arises that power-supply noise may be superimposed on the internal clock signals PCLKR and PCLKF because of the relay buffers. Therefore, the frequency of the internal clock signals PCLKR and PCLKF is divided by the frequency dividing circuit 23 to generate the frequency-divided clock signals CLK0 to CLK7 that are then transmitted to the second peripheral circuit region C2 via the clock line LINE of long distance. The frequency-divided clock signals CLK0 to CLK7 are multiplied by the multiplier circuit 24 that is placed in the second peripheral circuit region C2. As a result, the internal clock signal CLKDQ is regenerated so as to have the same frequency as the internal clock signals PCLKR and PCLKF. According to the above configuration, even though the clock line LINE is quite long, it is possible to improve the quality of the internal clock signal CLKDQa used in the data input/output circuit 81.

Figure 3:
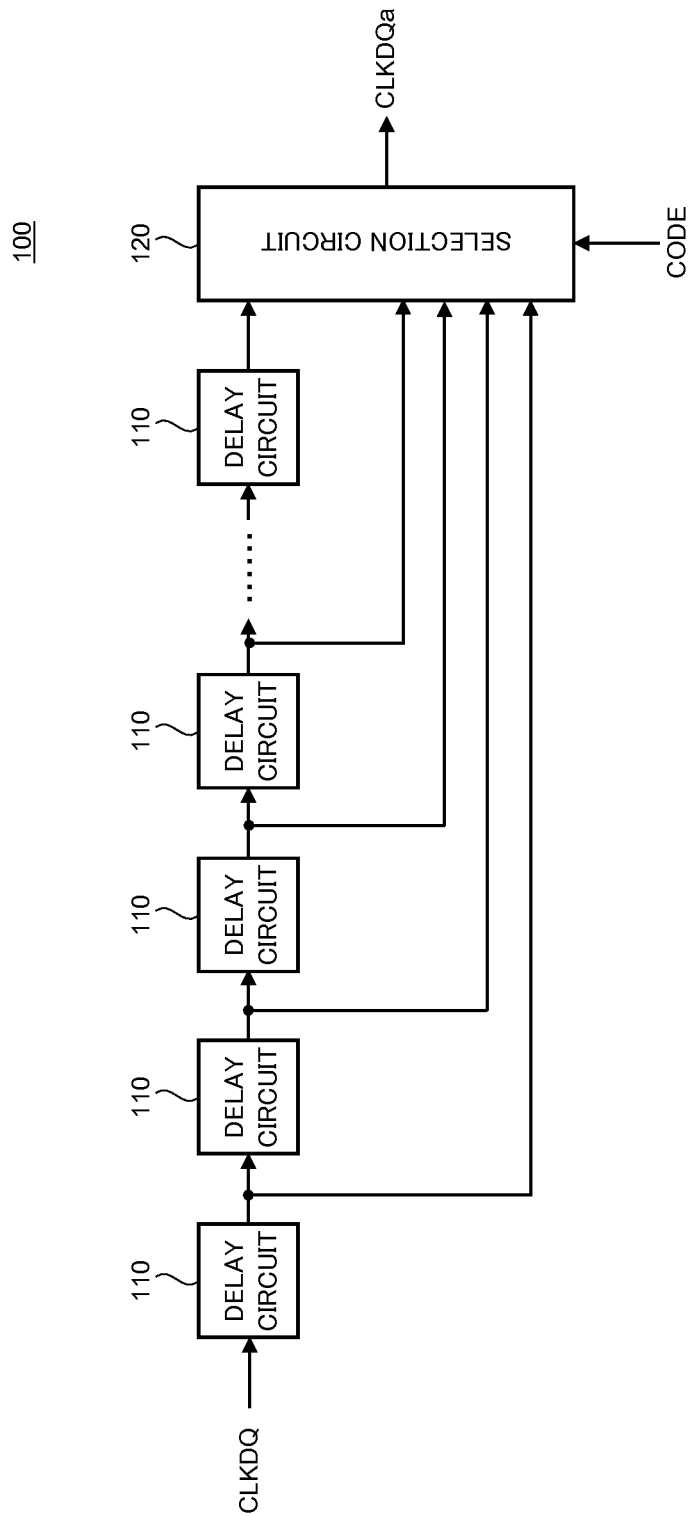
FIG. 3 is a block diagram indicative of a circuit configuration of a delay adjustment circuit shown in FIG. 1.

Turning to FIG. 3, the delay adjustment circuit 100 includes a plurality of delay circuits 110, which are connected in series; and a selection circuit 120, which receives output signals of the delay circuits 110. To the first delay circuit 110, the internal clock signal CLKDQ is supplied. The internal clock signal is delayed before being transmitted to the subsequent delay circuits 110. Therefore, the output signals coming out of the delay circuits 110 are delayed more in terms of timing as the output signals go down a series of delay circuits 110. To the selection circuit 120, the delay code CODE is supplied. Based on the delay code CODE, one of the output signals of the delay circuits 110 is output as an internal clock signal CLKDQa. The above configuration makes it possible to adjust the timing of the internal clock signal CLKDQa on the basis of the delay code CODE. The fact means that it is possible to adjust the propagation time, which is the time required for a corresponding active edge of the internal clock signal CLKDQa to reach the data input/output circuit 81 after the external clock signals CK and CKB are input to the clock terminals 11a and 11b.

Figure 4:
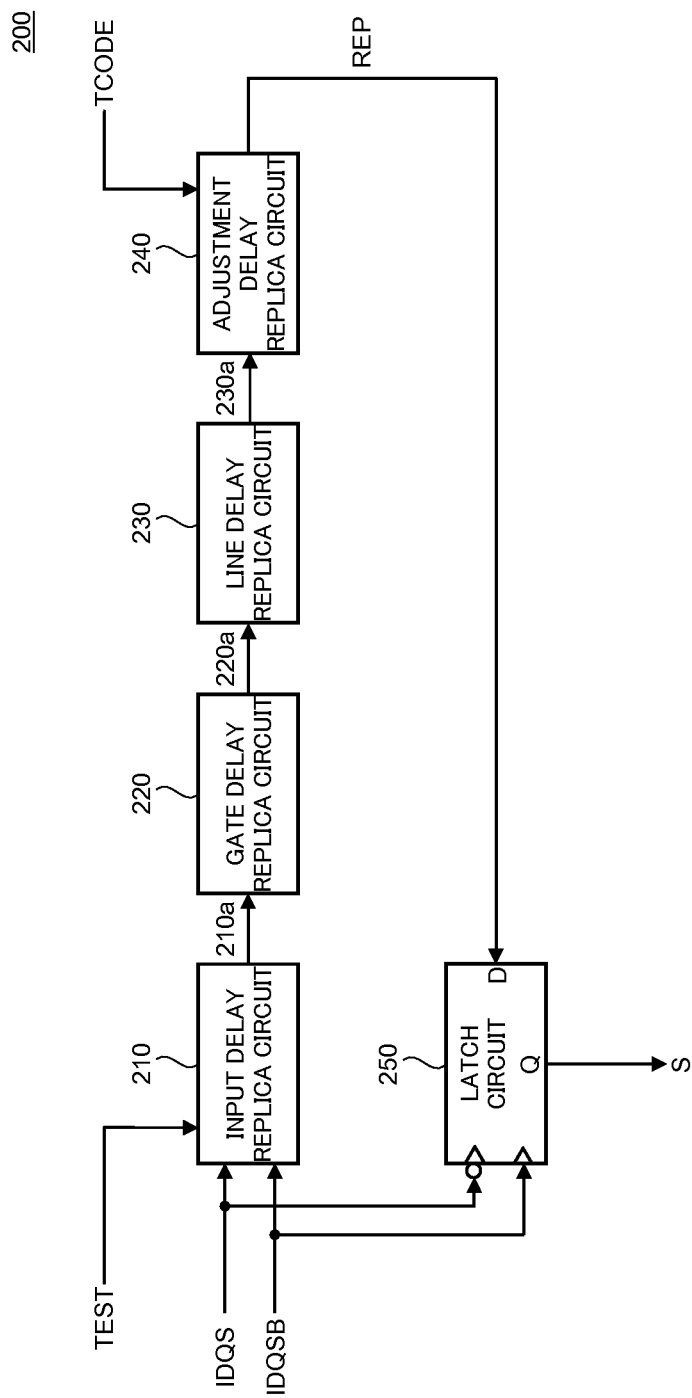
FIG. 4 is a block diagram indicative of a circuit configuration of a measurement circuit shown in FIG. 1.

Turning to FIG. 4, the delay circuit 200 includes a series circuit, which contains an input delay replica circuit 210, a gate delay replica circuit 220, a line delay replica circuit 230, and an adjustment delay replica circuit 240; and a latch circuit 250. The replica circuits 210 to 240 are replica circuits that are designed to monitor the propagation time of the internal clock signal, i.e. the time required for a corresponding active edge of the internal clock signal CLKDQa to reach the data input/output circuit 81 after the external clock signals CK and CKB are input to the clock terminals 11a and 11b.

More specifically, the input delay replica circuit 210 is a replica circuit of the clock input circuit 21 shown in FIG. 1. The input delay replica circuit 210 has a delay time that is proportional to the delay time of the clock input circuit 21.

Although not specifically restricted in terms of specific circuit configuration, the input delay replica circuit 210 can employ the same circuit as the clock input circuit 21. The input delay replica circuit 210 is activated by a test mode signal TEST supplied from the mode register 54. The test mode signal TEST is a signal that is activated at a time when the mode register 54 is set to a predetermined test mode. Therefore, the replica circuits 210 to 240 are used only in test mode.

The gate delay replica circuit 220 is a replica circuit of a plurality of logic gate circuits that exist on a signal path between the clock input circuit 21 and the delay adjustment circuit 100. The gate delay replica circuit 220 has a delay time that is proportional to the delay time of a plurality of the logic gate circuits that exist on the signal path. Although not specifically restricted in terms of specific circuit configuration, the gate delay replica circuit 220 can employ an inverter chain that is made up of a plurality of inverter circuits connected in series. The line delay replica circuit 230 is a replica circuit of the clock line LINE shown in FIG. 2. The line delay replica circuit 230 has a delay time that is proportional to the delay time of the clock line LINE. Although not specifically restricted in terms of specific circuit configuration, the line delay replica circuit 230 can employ a line pattern similar to the clock line LINE. The adjustment delay replica circuit 240 is a replica circuit of the delay adjustment circuit 100 shown in FIG. 1, and is able to adjust the amount of delay on the basis of a test delay code TCODE. Although not specifically restricted in terms of specific circuit configuration, the adjustment delay replica circuit 240 may have the same circuit configuration as the delay adjustment circuit 100. The way that the test delay code TCODE is input is not specifically restricted: a setting value of the mode register 54 may be input into the adjustment delay replica circuit 240; or the value may be input directly from the command address terminal 12a or the data input/output terminal 14.

The latch circuit 250 is a circuit that latches a replica signal REP, which is output from the adjustment delay replica circuit 240, in synchronization with the internal data strobe signals IDQS and IDQSB. The latch circuit of the present embodiment latches the replica signal REP supplied to an input node D at a time when the internal data strobe signal IDQS is changed to a low level, or when the internal data strobe signal IDQSB is changed to a high level. The signal latched by the latch circuit 250 is output as a measurement result S from an output node Q, and is supplied to the data input/output circuit 81. In the case of the present invention, the internal data strobe signals IDQS and IDQSB that are supplied to the measurement circuit 200 are also referred to as "test signals".

The amounts of delay by the replica circuits 210 to 240 are enough if the amounts are proportional to the propagation time of the internal clock signal. There is no need to make the amounts of delay by the replica circuits 210 to 240 equal to the propagation time of the internal clock signal. In one example, the amounts of delay by the replica circuits 210 to 240 can be designed so as to be four times as large as the propagation time of the internal clock signal. In this manner, if the amounts of delay by the replica circuits 210 to 240 are designed so as to be larger than the propagation time of the internal clock signal, accurate measurement is possible with the measurement circuit 200 even if a low-speed tester is used.

Figure 5:
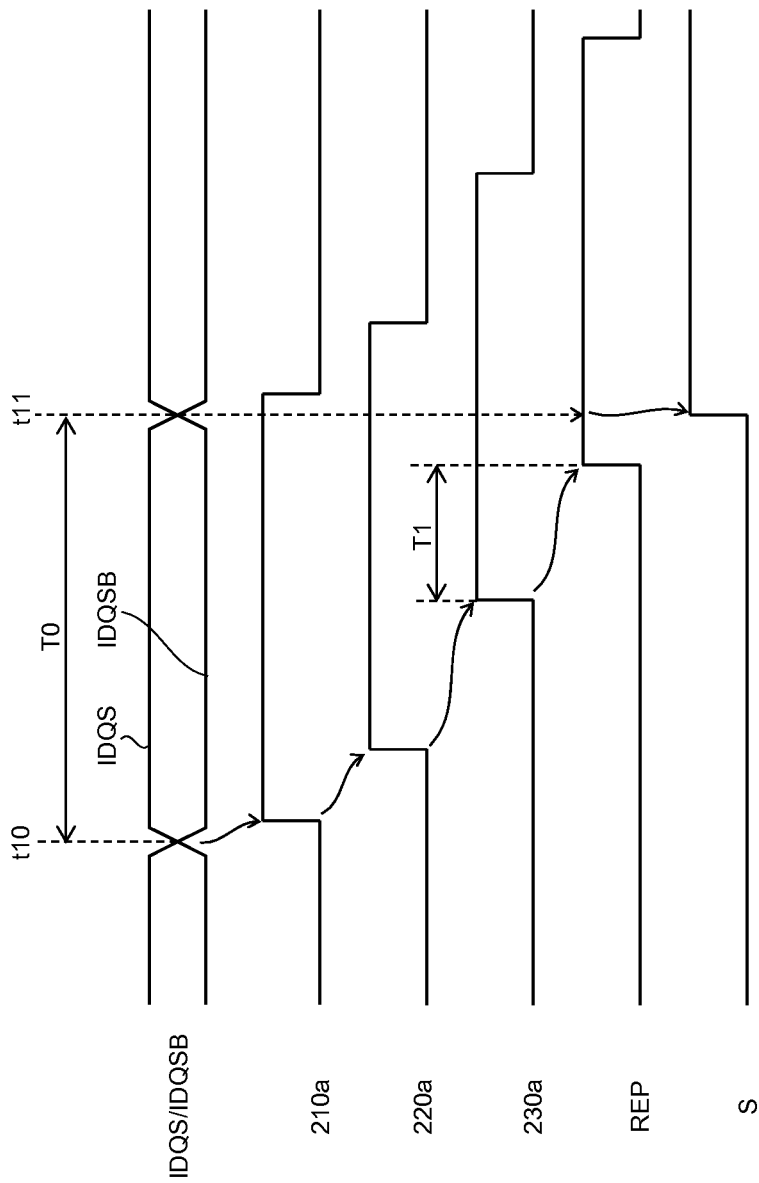
FIG. 5 is a timing chart for explaining an operation of the measurement circuit shown in FIG. 4 and shows the case where a measurement result S is at a high level.
Figure 6:
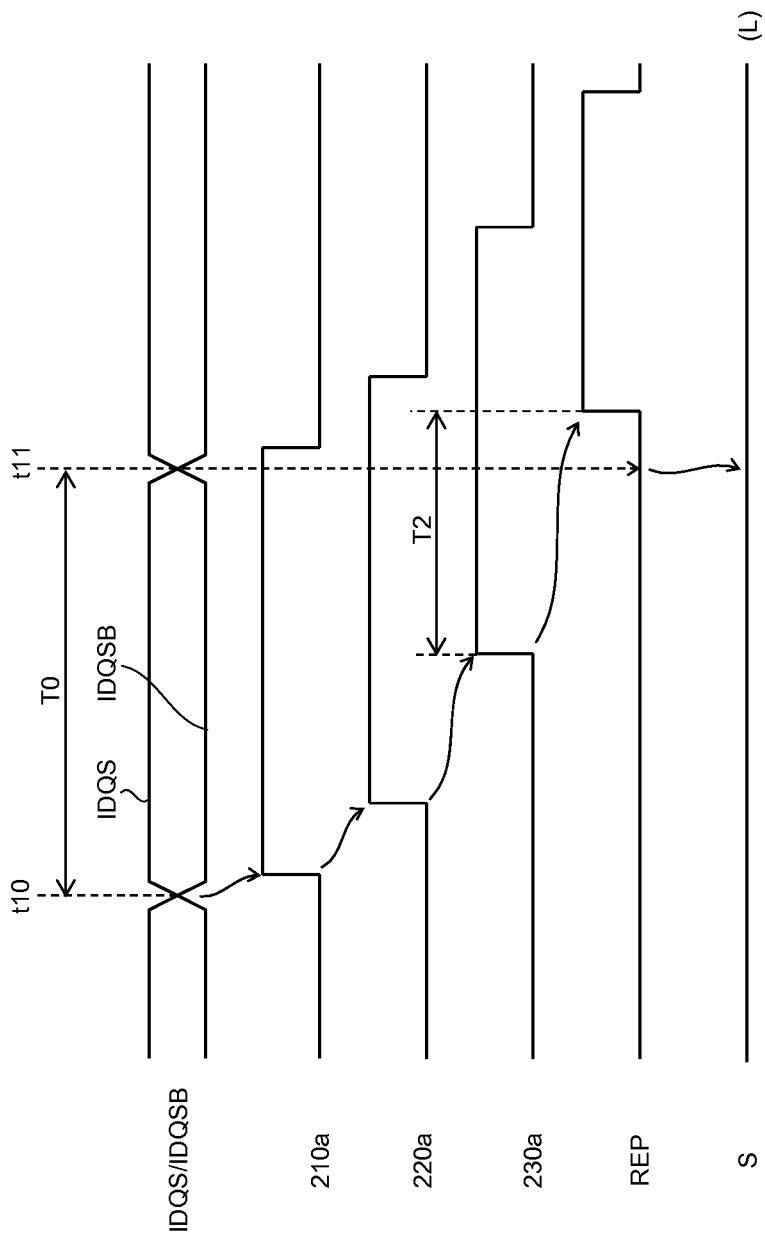
FIG. 6 is a timing chart for explaining an operation of the measurement circuit shown in FIG. 4 and shows the case where a measurement result S is at a low level.

Turning to FIGS. 5 and 6, the reference symbols 210a, 220a, and 230a are output signals of the replica circuits 210, 220, and 230 shown in FIG. 4, respectively.

In the example shown in FIG. 5, the amount of delay by the adjustment delay replica circuit 240 is set to T1. As a result, at a time when a period T0 has passed, the level of the replica signal REP is at a high level, where the period T0 is a period that starts at time t10, when the internal data strobe signal IDQS is changed from a low level to a high level (or when the internal data strobe signal IDQSB is changed from a high level to a low level), and ends at time t11, when the internal data strobe signal IDQS is changed from a high level to a low level (or when the internal data strobe signal IDQSB is changed from a low level to a high level). Accordingly, a high-level signal is latched by the latch circuit 250, and the measurement result S is at a high level.

In the example shown in FIG. 6, the amount of delay by the adjustment delay replica circuit 240 is set to T2 (>T1). As a result, at a time when a period T0 has passed, the level of the replica signal REP is at a low level, where the period T0 is a period that starts at time t10, when the internal data strobe signal IDQS is changed from a low level to a high level (or when the internal data strobe signal IDQSB is changed from a high level to a low level), and ends at time t11, when the internal data strobe signal IDQS is changed from a high level to a low level (or when the internal data strobe signal IDQSB is changed from a low level to a high level). Accordingly, a low-level signal is latched by the latch circuit 250, and the measurement result S is at a low level.

In that manner, depending on the amount of delay by the adjustment delay replica circuit 240, the logic level of the obtained measurement result S is different. More specifically, if amount of delay by the replica circuits 210 to 240 is shorter than the pulse width of the internal data strobe signals IDQS and IDQSB, then the measurement result S is at a high level as in the example shown in FIG. 5. If amount of delay by the replica circuits 210 to 240 is longer than the pulse width of the internal data strobe signals IDQS and IDQSB, then the measurement result S is at a low level as in the example shown in FIG. 6. Therefore, if the measurement result S is referred to while gradually changing the amount of delay by the adjustment delay replica circuit 240 by changing the test delay code TCODE, it is possible to evaluate the propagation time of the internal clock signal. In one example, by gradually decreasing the amount of delay by the adjustment delay replica circuit 240 by one pitch from a minimum value and sequentially carrying out measurement, it turns out that the amount of delay at a time when the logic level of the measurement result S is changed from a high level to a low level corresponds to the propagation time of the internal clock signal. If the amount of delay by the replica circuits 210 to 240 is so designed as to be four times as large as the propagation time of the internal clock signal, one-fourth of the amount of delay at a time when the logic level of the measurement result S is changed from a high level to a low level is equal to the propagation time of the internal clock signal.

The above-described process of measuring the propagation time can be conducted on a semiconductor wafer during the manufacturing process of the semiconductor device 10. The following describes a method of manufacturing the semiconductor device 10 according to the present embodiment.

Figure 7:
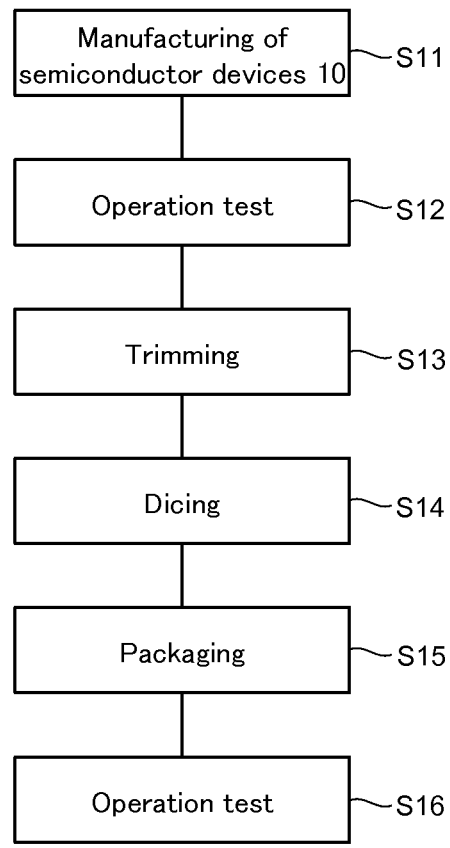
FIG. 7 is a flowchart indicative of an outline of a manufacturing method of the semiconductor device shown in FIG. 1.

Turning to FIG. 7, first, on a semiconductor wafer, manufacturing of semiconductor devices 10 starts (Step S11). On the semiconductor wafer, a large number of semiconductor devices 10 having the same circuit configuration are simultaneously formed. However, in process conditions, in-plane variations exist. Accordingly, even if the semiconductor devices 10 are formed on the same semiconductor wafer, the semiconductor devices 10 are not necessarily equal in the propagation time of the internal clock signal.

Then, an operation test is performed on the semiconductor wafer (Step S12). The operation test is a test for detecting a defective word line or a defective bit line mainly contained in the memory cell array 70. The operation test is performed in parallel for a large number of semiconductor devices 10. The tester that is used for the operation test therefore needs a large-capacity memory to map defective addresses of a large number of semiconductor devices 10. The operation speed thereof is inevitably slow. As described later, during the operation test, the monitoring of the propagation time is also performed with the use of the measurement circuit 200.

After the operation test is completed, trimming of the semiconductor devices 10 is performed on the basis of the results of the operation test (Step S13). The trimming is performed mainly to record the detected defective addresses in an optical fuse. As a result, the defective word lines and defective bits detected by the operation test of step S12 are replaced with redundant word lines and redundant bit lines, and the defective addresses are rescued. Furthermore, at step S13, on the basis of the propagation time measured at step SP12, trimming of the storage circuit 25 is also performed.

Then, the semiconductor wafer is diced into pieces of semiconductor devices 10, and the semiconductor devices 10 are taken out (Step S14) and packaged (Step S15). After that, for the packaged semiconductor devices 10, an operation test is conducted for product selection (Step S16). During the operation test of step S16, unlike the operation test of step S12, a high-speed tester is used.

Figure 8:
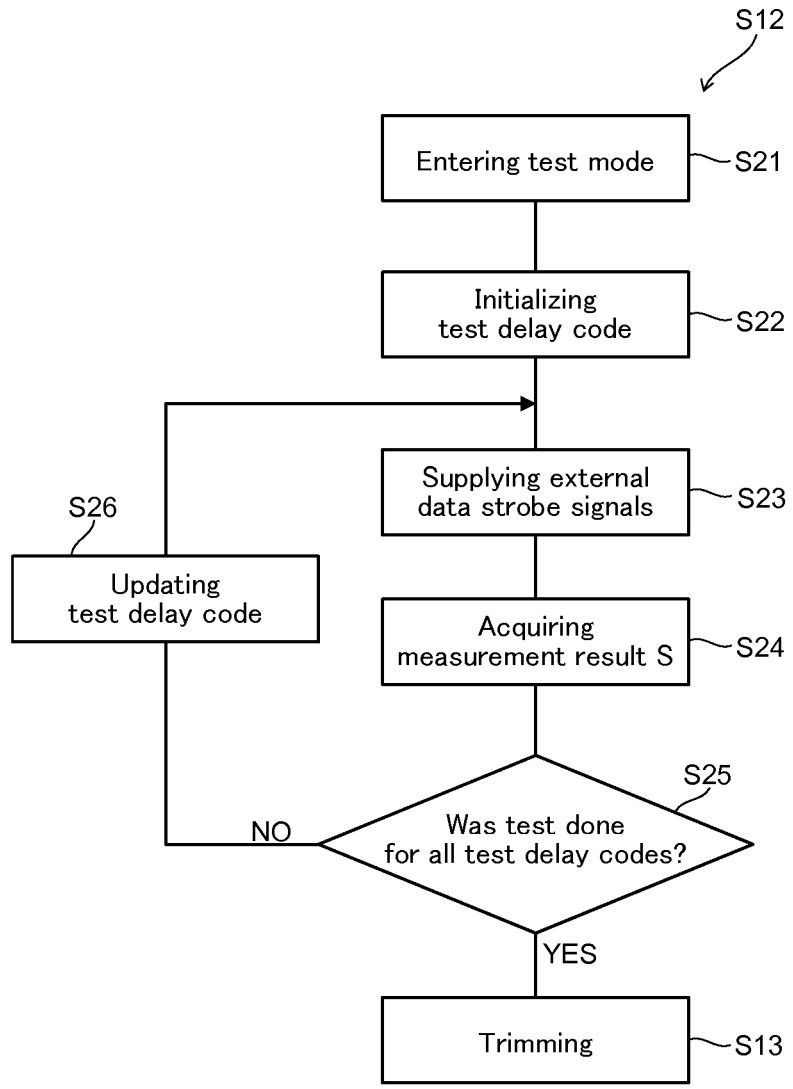
FIG. 8 is a flowchart for explaining in more detail an operation associated with the present invention during the operation test of step S12.

As described above, the operation test of step S12 is performed in parallel for a plurality of semiconductor devices 10 with the use of a low-speed tester. Turning to FIG. 8, first, to a plurality of semiconductor devices 10 to be tested, a test command is issued via the command address terminals 12*a*, thereby making the semiconductor devices 10 enter a predetermined test mode (Step S21). After entering the test mode, from the mode register 54 of each semiconductor device 10, a test mode signal TEST is output, thereby bringing about the state where the measurement circuit 200 can measure the propagation time.

Then, the test delay code TCODE is set to an initial value (Step S22), and the external data strobe signals DQS and DQSB are then supplied to each semiconductor device 10 (Step S23). The initial value of the test delay code TCODE may be a value indicating a minimum delay amount, or a value indicating a maximum delay amount. If the external data strobe signals DQS and DQSB are supplied to each semiconductor device 10 at the time, a high- or low-level measurement result S is obtained. A tester acquires the measurement results S via the data input/output terminals 14, and temporarily stores the measurement results S in a work memory inside the tester (Step S24). As described above with reference to FIGS. 5 and 6, if the measurement result S is at a high level, the amount of delay by the replica circuits 210 to 240 is shorter than the pulse width of the internal data strobe signals IDQS and IDQSB. If the measurement result S is at a low level, the amount of delay by the replica circuits 210 to 240 is longer than the pulse width of the internal data strobe signals IDQS and IDQSB.

The test delay code TCODE becomes updated as the above operation is repeatedly performed (Steps S23 to 26). For example, if the amount of delay set at step S22 is a minimum delay amount, the delay amount is gradually increased at a rate of one pitch at step S26. In this case, the measurement result S obtained at first is expected to be at a high level. Then, after the amount of delay by the replica circuits 210 to 240 reaches a predetermined delay amount, the measurement result S obtained afterward is changed to a low level. In this case, the test delay code TCODE immediately before the measurement result S is changed from a high level to a low level corresponds to the propagation time of the internal clock signal. Incidentally, as described above, it is preferred that the amount of delay by the measurement circuit 200 be so designed as to be larger than the propagation time of the internal clock signal. For example, if the amount of delay by the measurement circuit 200 is so designed as to be four times as large as the propagation time of the internal clock signal, the time equivalent to one-fourth of the amount of delay immediately before the measurement result S is changed from a high level to a low level is equal to the propagation time of the internal clock signal. During the operation test of step S12, a low-speed tester is used. Therefore, it is difficult to perform measurement if the amount of delay by the measurement circuit 200 is so designed as to be equal to the propagation time of the internal clock signal. However, as described above, if the amount of delay by the measurement circuit 200 is so designed as to be, for example, four times as large as the propagation time of the internal clock signal, the propagation time of the internal clock signal can be accurately measured even with a low-speed tester.

After the test with all the test delay codes TCODE is completed (YES: Step S25), trimming is performed on the basis of the propagation time of the internal clock signal that is obtained by measurement (Step S13). The trimming is performed for the storage circuit 25 shown in FIG. 1. For example, if the storage circuit 25 is made up of an optical fuse element, a laser beam is emitted to a predetermined fuse element to cut. In this manner, a predetermined delay code CODE is written to the storage circuit 25 in a nonvolatile manner. Incidentally, the cutting of an optical fuse element by laser beam is also performed when a defective address is stored.

The delay code CODE that is written to the storage circuit 25 is preferably a value by which the propagation times of the internal clock signal are equal to each other between the semiconductor devices 10. For example, if a default value of the delay adjustment circuit 100 is set as a minimum delay amount, all that is required is to increase the amount of delay by the delay adjustment circuit 100, on the basis of a semiconductor device 10 whose propagation time of the internal clock signal is slowest among a plurality of semiconductor devices 10 to be tested, in such a way that the propagation time of the internal clock signal in each of the other semiconductor devices 10 becomes equal to the above propagation time. If a default value of the delay adjustment circuit 100 is set as a maximum delay amount, all that is required is to decrease the amount of delay by the delay adjustment circuit 100, on the basis of a semiconductor device 10 whose propagation time of the internal clock signal is fastest among a plurality of semiconductor devices 10 to be tested, in such away that the propagation time of the internal clock signal in each of the other semiconductor devices 10 becomes equal to the above propagation time. Alternatively, a target propagation time may be set in advance, and, for a semiconductor device 10 whose propagation time of the internal clock signal is slower than the target value, the amount of delay by the delay adjustment circuit 100 may be decreased; for a semiconductor device 10 whose propagation time of the internal clock signal is faster than the target value, the amount of delay by the delay adjustment circuit 100 may be increased. In that manner, the delay code CODE is written to the storage circuit 25. As a result, the propagation times of the internal clock signal become substantially equal to each other among a plurality of semiconductor devices 10 to be tested.

Figure 9:
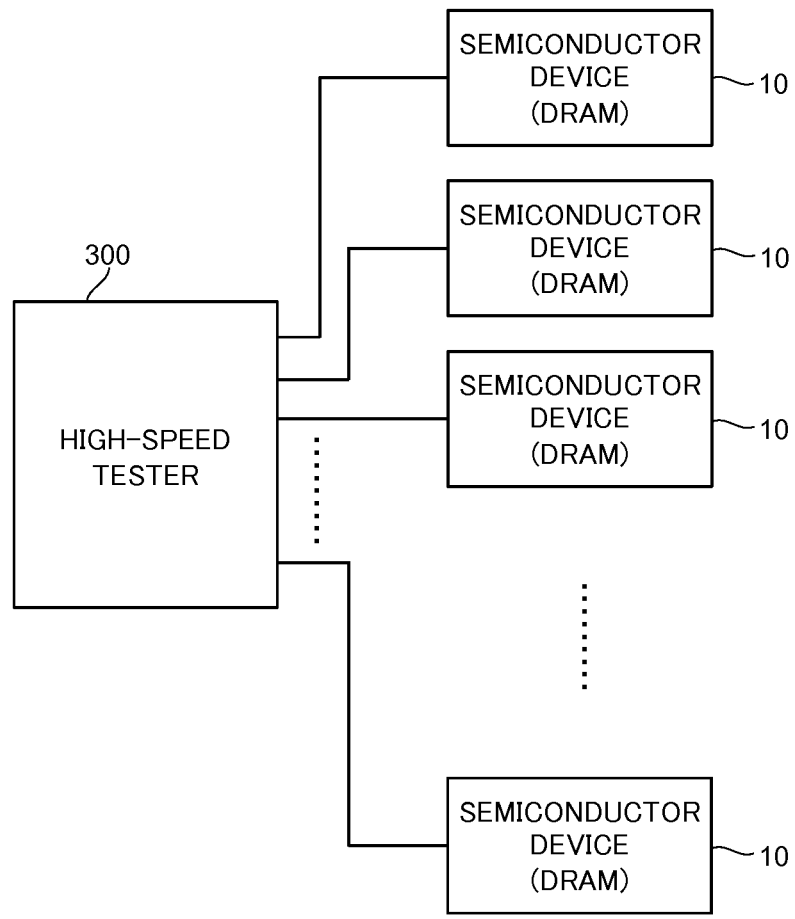
FIG. 9 is a block diagram indicative of an embodiment of relation of connection when an operation test is conducted.

After the trimming is completed, as described above, dicing (step S14) and packaging (Step S15) are performed. After that, an operation test is conducted for product selection (Step S16). The operation test of step S16 is conducted in parallel for a plurality of semiconductor devices 10 after a high-speed tester 300 is connected to a plurality of the semiconductor devices 10 as shown in FIG. 9. The operation test that uses the high-speed tester 300 is a high-speed test that simulates actual use of the semiconductor devices 10. In some cases, the external clock signals CK and CKB whose clock cycle is shorter than the allowable range of the delay time tAC are used. Therefore, if the delay time tAC varies for each semiconductor device 10, it is difficult to appropriately conduct the operation tests in parallel even if the delay time tAC is within the allowable range.

However, according to the present embodiment, because of the trimming of the storage circuit 25, the propagation times of the internal clock signal are substantially equal to each other between a plurality of semiconductor devices 10. Therefore, the delay times tAC, too, are substantially equal to each other between the semiconductor devices 10. Thus, it is possible to easily perform the operation test in parallel for a plurality of semiconductor devices 10 with the use of the high-speed tester 300.

Figure 10:
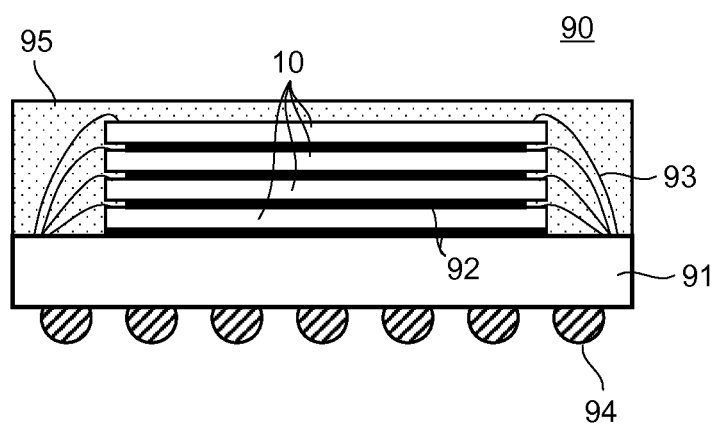
FIG. 10 is a schematic cross-sectional view indicative of a structure of a multichip package that uses the semiconductor device shown in FIG. 1.

Turning to FIG. 10. the multichip package 90 has the structure in which four semiconductor devices 10 are stacked on a package substrate 91. The semiconductor devices 10 and package substrate 91 that are adjacent in the vertical direction are fixed with an adhesive 92. The semiconductor devices 10 and the package substrate 91 are connected together by bonding wires 93. As a result, each semiconductor device 10 is electrically connected to external electrodes 94 via internal lines (not shown) provided in the package substrate 91. On the package substrate 91, encapsulation resin 95 is provided to protect the semiconductor devices 10 and the bonding wires 93.

If semiconductor devices 10 that are substantially equal to each other in delay time tAC are used as the four semiconductor devices 10 that are stacked in the multichip package 90, it is possible to provide a multichip package 90 with no difference in access time therebetween. As described above, according to the present embodiment, it is possible to easily acquire the semiconductor devices 10 that are substantially equal to each other in delay time tAC.

In that manner, even though the semiconductor devices 10 of the present embodiment are memory devices not having a DLL circuit, the delay times tAC can be set to a certain value. Therefore, it is possible to easily perform a high-speed operation test in parallel after packaging. Moreover, as described above with reference to FIG. 10, it is also possible to provide a multichip package 90 with no difference in access time between the semiconductor devices. Incidentally, the semiconductor devices 10 of the present embodiment can be applied not only to the multichip package 90, but also to a stacked semiconductor device of another type.

Hereinafter, a preferred second embodiment of the present invention will be described.

Figure 11:
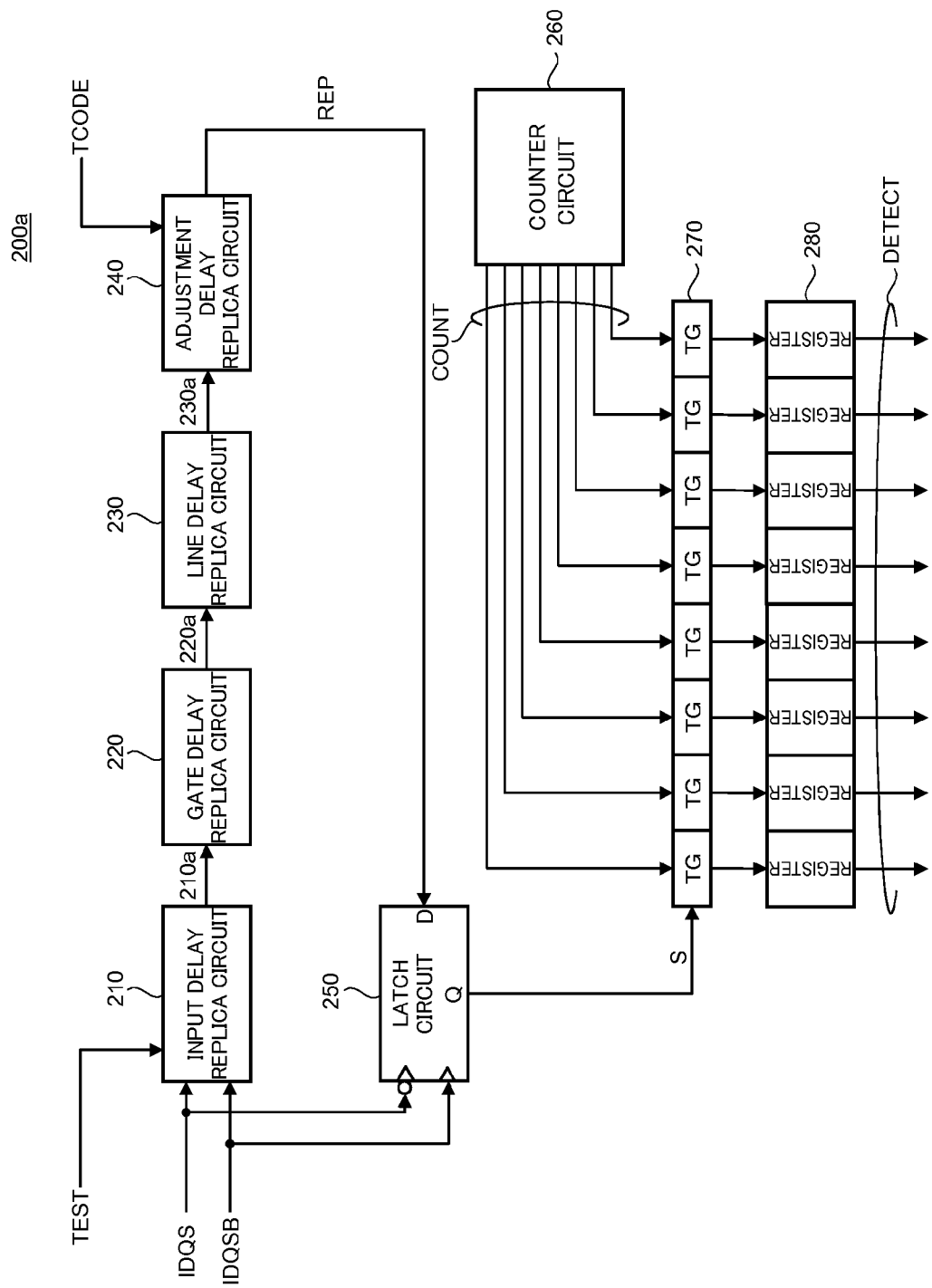
FIG. 11 is a block diagram indicative of a circuit configuration of a measurement circuit used in a second embodiment of the present invention.

Referring now to FIG. 11, the measurement circuit 200a is formed by adding the following components to the measurement device 200 shown in FIG. 4: a counter circuit 260, transfer gates 270, and register circuits 280. The counter circuit 260 is for example an eight-bit binary counter; each time the operation of measuring the propagation time is performed, a count value COUNT is incremented or decremented. The method of incrementing or decrementing the counter circuit 260 each time the operation of measuring the propagation time is performed may be: a method by which a test mode signal TEST is used as a trigger; or a method by which a change in the internal data strobe signals IDQS and IDQSB is used as a trigger. In any case, all that is required is to control in such a way as to output a different count value COUNT each time the internal data strobe signal IDQS is changed from a low level to a high level (or each time the internal data strobe signal IDQSB is changed from a high level to a low level) when entering a test mode.

The count value COUNT output from the counter circuit 260 is supplied to a corresponding register circuit 280 via a corresponding transfer gate 270. The transfer gates 270 allow the count value COUNT to pass therethrough when the measurement result S is at a high level, and block the count value COUNT when the measurement result S is at a low level. As a result, if the test delay code TCODE set at step S22 of FIG. 8 is a minimum delay amount, the count value COUNT is latched by the register circuits 280 because the measurement result S obtained at first is at a high level. Then, each time the test delay code TCODE is updated at step S26, the value of the count value COUNT changes. However, as long as the measurement result S is at a high level, the count value COUNT is overwritten in the register circuits 280. When the measurement result S is changed to a low level, the value of the register circuits 280 is not overwritten even if the value of the count value COUNT is changed, and the previous value remains in the register circuits 280.

Accordingly, after the test is completed for all the test delay codes TCODE (Step S25: YES), the value that remains in the register circuit 280 becomes a count value COUNT corresponding to a test delay code TCODE that appears immediately before the measurement result S is changed from a high level to a low level. The value is output as a detection value DETECT, and is supplied to a tester via the data input/output circuit 81 and the data input/output terminal 14. The tester performs the trimming of the storage circuit 25 on the basis of the detection value DETECT obtained from each semiconductor device 10.

As described above, according to the present embodiment, the measurement circuit 200a has the register circuits 280 that hold a count value COUNT corresponding to a test delay code TCODE that appears immediately before the measurement result S is changed from a high level to a low level. Therefore, there is no need for a tester to acquire the measurement result S each time measurement is conducted. Accordingly, a test program required for the tester can be simplified. Furthermore, compared with the above embodiment, the test time is expected to be shortened.

Hereinafter, a preferred third embodiment of the present invention will be described.

Figure 12:
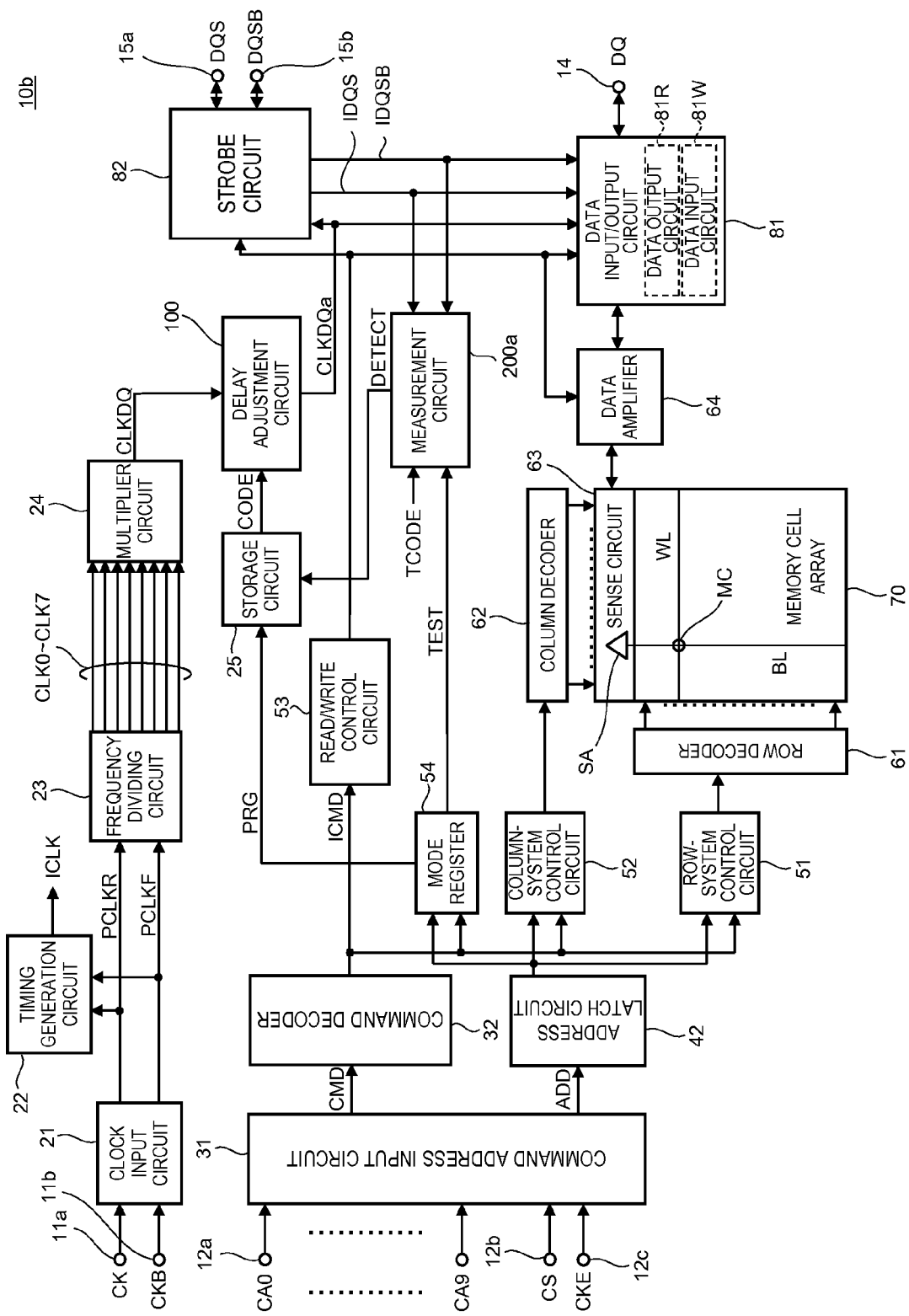
FIG. 12 is a block diagram indicative of a configuration of a semiconductor device according to a preferred third embodiment of the present invention.

Turning to FIG. 12, the semiconductor device 10b is different from the semiconductor device 10 shown in FIG. 1 in that a detection value DETECT output from the measurement circuit 200a is supplied to the storage circuit 25. The other components of the semiconductor device 10b are basically identical to those of the semiconductor device 10 shown in FIG. 1. Therefore, the same components are represented by the same reference symbols, and the description of the same components is omitted.

According to the present embodiment, when the mode register 54 is set to a predetermined test mode, a program signal PRG is supplied to the storage circuit 25. According to the present embodiment, the storage circuit 25 includes a nonvolatile storage element such as anti-fuse element to which the delay code CODE can be electrically written. When the program signal PRG is activated, a detection value DETECT or a corresponding value thereof is written as a delay code CODE. As a result, there is no need for the tester to acquire the measurement result S and the detection value DETECT. Thus, a test program required for the tester can be further simplified. Furthermore, compared with the above embodiments, the test time is expected to be further shortened.

Hereinafter, a preferred fourth embodiment of the present invention will be described.

Figure 13:
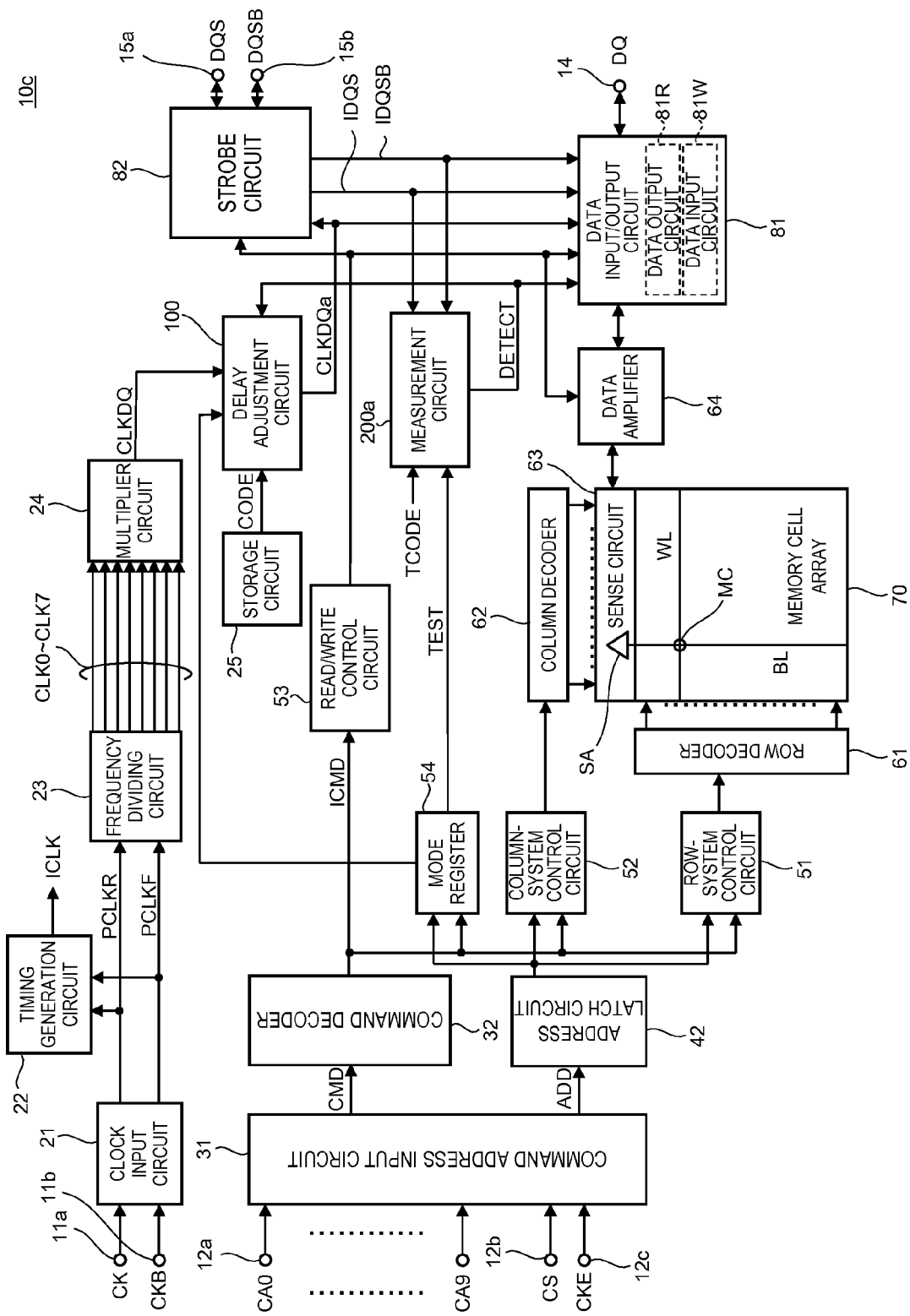
FIG. 13 is a block diagram indicative of a configuration of a semiconductor device 10c according to a preferred fourth embodiment of the present invention.
Figure 14:
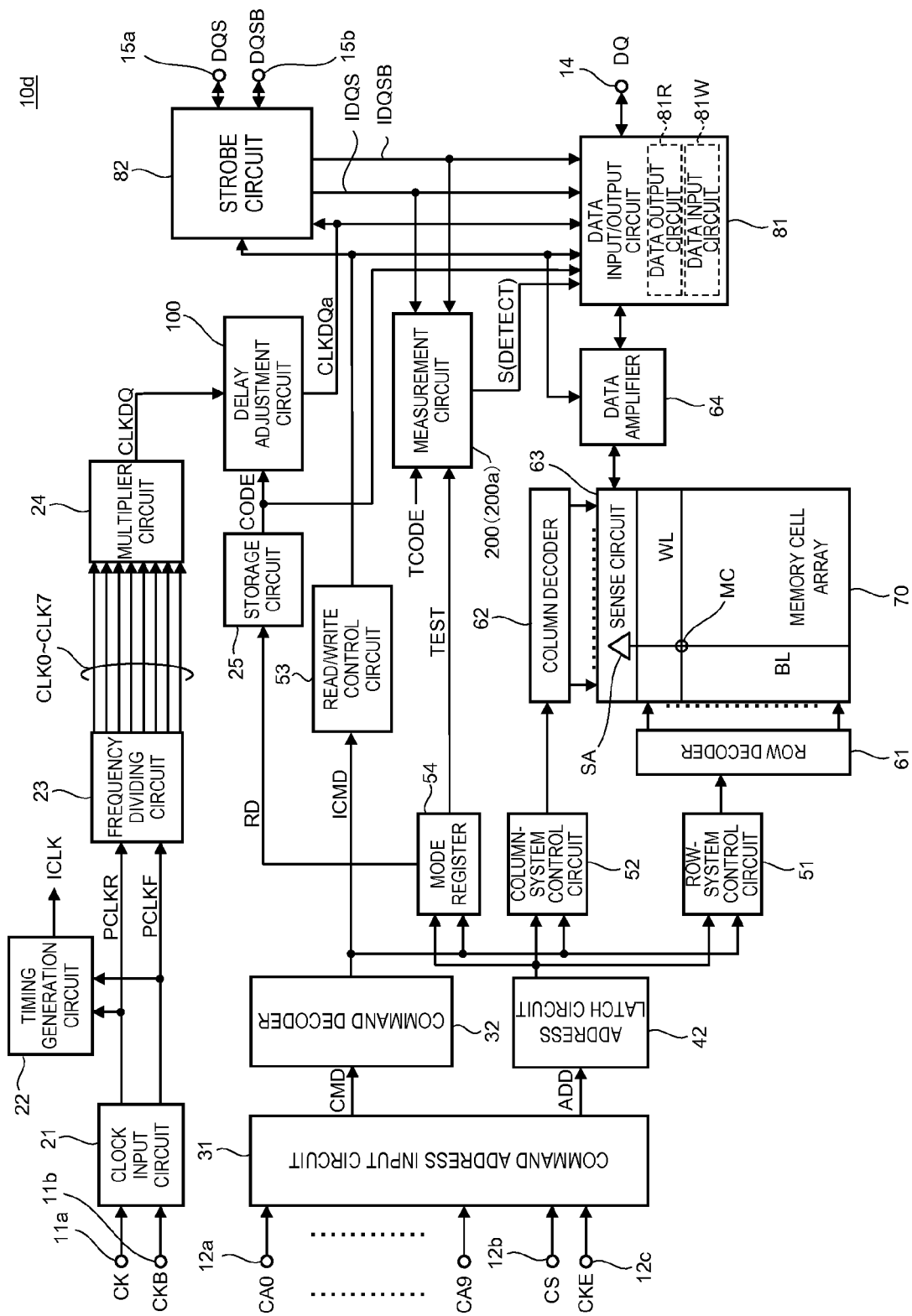
FIG. 14 is a block diagram indicative of a configuration of a semiconductor device 10d according to a preferred fifth embodiment of the present invention.

Turning to FIG. 13, the semiconductor device 10c is different from the semiconductor device 10 shown in FIG. 1 in that a detection value DETECT output from the measurement circuit 200a is supplied to the delay adjustment circuit 100. The other components of the semiconductor device 10c are basically identical to those of the semiconductor device 10 shown in FIG. 1. Therefore, the same components are represented by the same reference symbols, and the description of the same components is omitted.

The present embodiment is characterized in that the delay adjustment circuit 100 can be directly controlled with the use of a detection value DETECT. According to the above configuration, even after the amount of delay by the delay adjustment circuit 100 is determined by trimming of the storage circuit 25, the amount of delay by the delay adjustment circuit 100 can be changed at any time. For example, by issuing a test command, the operation test illustrated in FIG. 8 is performed when the semiconductor device is actually used, and the amount of delay by the delay adjustment circuit 100 can be changed based on the result thereof. In this manner, a user can change the delay time tAC.

Hereinafter, a preferred fifth embodiment of the present invention will be described.

Turning to the semiconductor device 10d is different from the semiconductor device 10 shown in FIG. 1 in that a delay code CODE output from the storage circuit 25 is supplied to the data input/output circuit 81. The other components of the semiconductor device 10d are basically identical to those of the semiconductor device 10 shown in FIG. 1. Therefore, the same components are represented by the same reference symbols, and the description of the same components is omitted.

According to the present embodiment, when the mode register 54 is set to a predetermined test mode, a code reading signal RD is supplied to the storage circuit 25. When the code reading signal RD becomes activated, the delay code CODE stored in the storage circuit 25 is output to outside via the data input/output circuit 81 and the data input/output terminal 14. Therefore, a user can confirm what kind of adjustments have been made during the manufacturing process.

Hereinafter, a preferred sixth embodiment of the present invention will be described.

According to the present embodiment, measurement is performed by changing the pulse width of the internal data strobe signals IDQS and IDQSB, instead of changing the amount of delay by the measurement circuit 200 with the use of the test delay code TCODE. Therefore, the amount of delay by the adjustment delay replica circuit 240 can remain unchanged. The amount of delay by the adjustment delay replica circuit 240 may be so designed as to be a delay time that is proportional to the delay time of the delay adjustment circuit 100 in the case where the delay code CODE indicates a default value.

Figure 15:
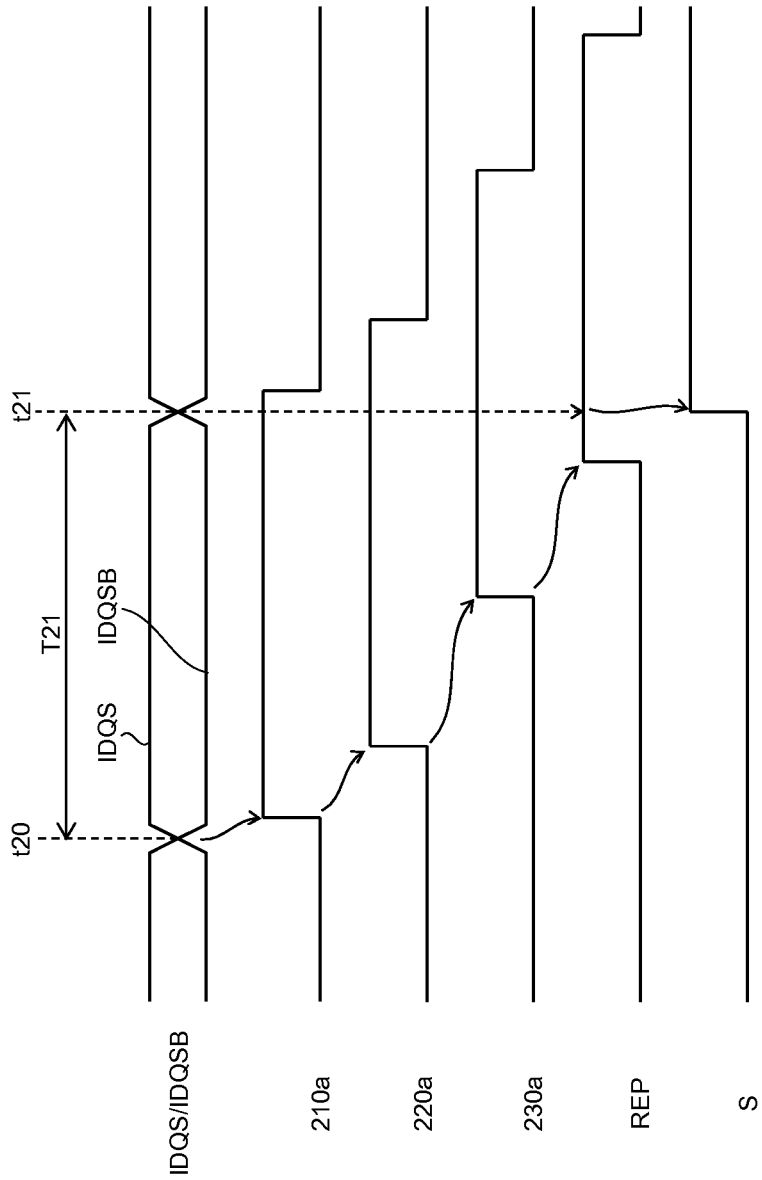
FIG. 15 is a timing chart for explaining an operation of the measurement circuit according to a preferred sixth embodiment of the present invention and shows the case where a measurement result S is at a high level.

Turning to FIG. 15, in the example, a period T21 is a period that starts at time t20, when the internal data strobe signal IDQS is changed from a low level to a high level (or when the internal data strobe signal IDQSB is changed from a high level to a low level), and ends at time t21, when the internal data strobe signal IDQS is changed from a high level to a low level (or when the internal data strobe signal IDQSB is changed from a low level to a high level). In the present example, at time t21, the level of a replica signal REP is at a high level. Accordingly, a high-level signal is latched by the latch circuit 250, and the measurement result S is at a high level.

Figure 16:
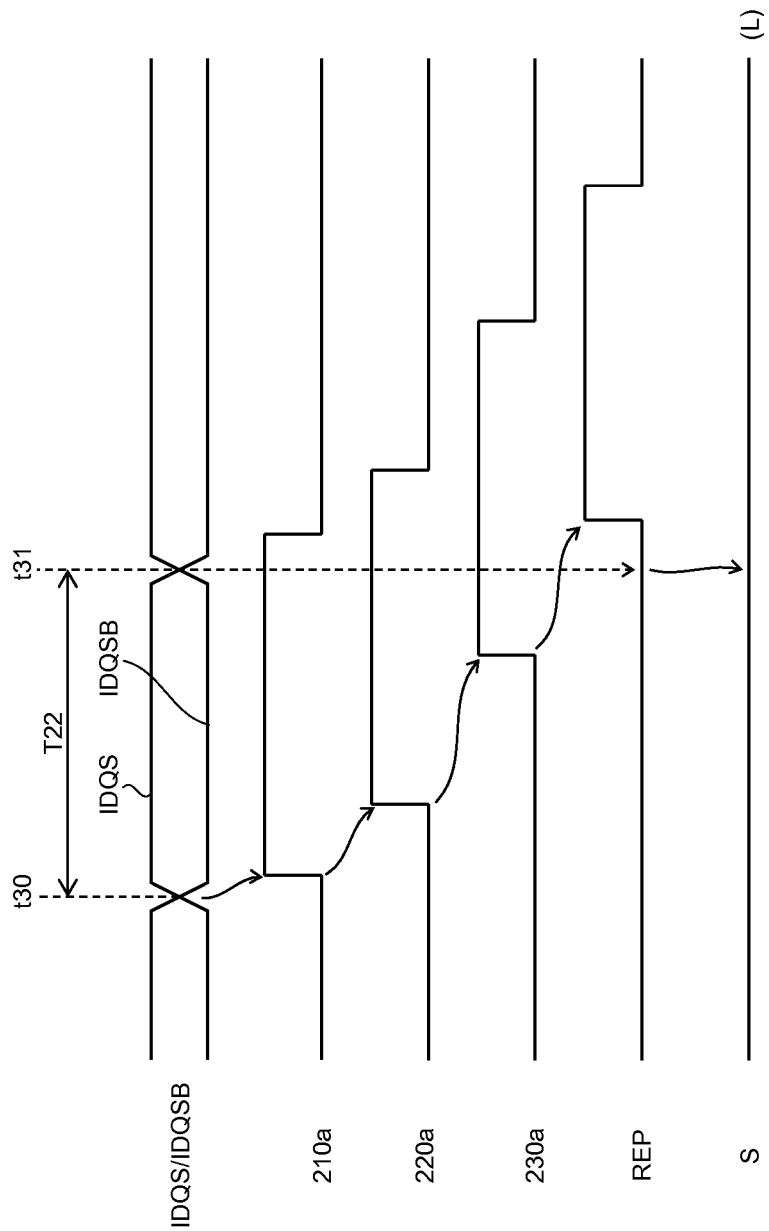
FIG. 16 is a timing chart for explaining an operation of the measurement circuit according to the preferred sixth embodiment of the present invention and shows the case where a measurement result S is at a low level.

In the example shown in FIG. 16, a period T22 (<T21) is a period that starts at time t30, when the internal data strobe signal IDQS is changed from a low level to a high level (or when the internal data strobe signal IDQSB is changed from a high level to a low level), and ends at time t31, when the internal data strobe signal IDQS is changed from a high level to a low level (or when the internal data strobe signal IDQSB is changed from a low level to a high level). In the present example, at time t31, the level of a replica signal REP is at a low level. Accordingly, a low-level signal is latched by the latch circuit 250, and the measurement result S is at a low level.

In that manner, depending on the pulse width of the internal data strobe signals IDQS and IDQSB, the logic level of the obtained measurement result S is different. More specifically, if the pulse width of the internal data strobe signals IDQS and IDQSB is longer than the amount of delay by the replica circuits 210 to 240, then the measurement result S is at a high level as in the example shown in FIG. 15. If the pulse width of the internal data strobe signals IDQS and IDQSB are shorter than the amount of delay by the replica circuits 210 to 240, then the measurement result S is at a low level as in the example shown in FIG. 16. As described above, the amount of delay by the replica circuits 210 to 240 is so designed as to be a delay amount that is proportional to the propagation time of the internal clock signal. Therefore, if the measurement result S is referred while gradually changing the pulse width of the internal data strobe signals IDQS and IDQSB, it is possible to evaluate the propagation time of the internal clock signal. In one example, by gradually decreasing the pulse width of the internal data strobe signals IDQS and IDQSB by one pitch from a maximum value and sequentially performing measurement, it turns out that the pulse width at a time when the logic level of the measurement result S is changed from a high level to a low level corresponds to the propagation time of the internal clock signal. If the amount of delay by the replica circuits 210 to 240 is so designed as to be four times as large as the propagation time of the internal clock signal, one-fourth of the pulse width at a time when the logic level of the measurement result S is changed from a high level to a low level is equal to the propagation time of the internal clock signal.

Figure 17:
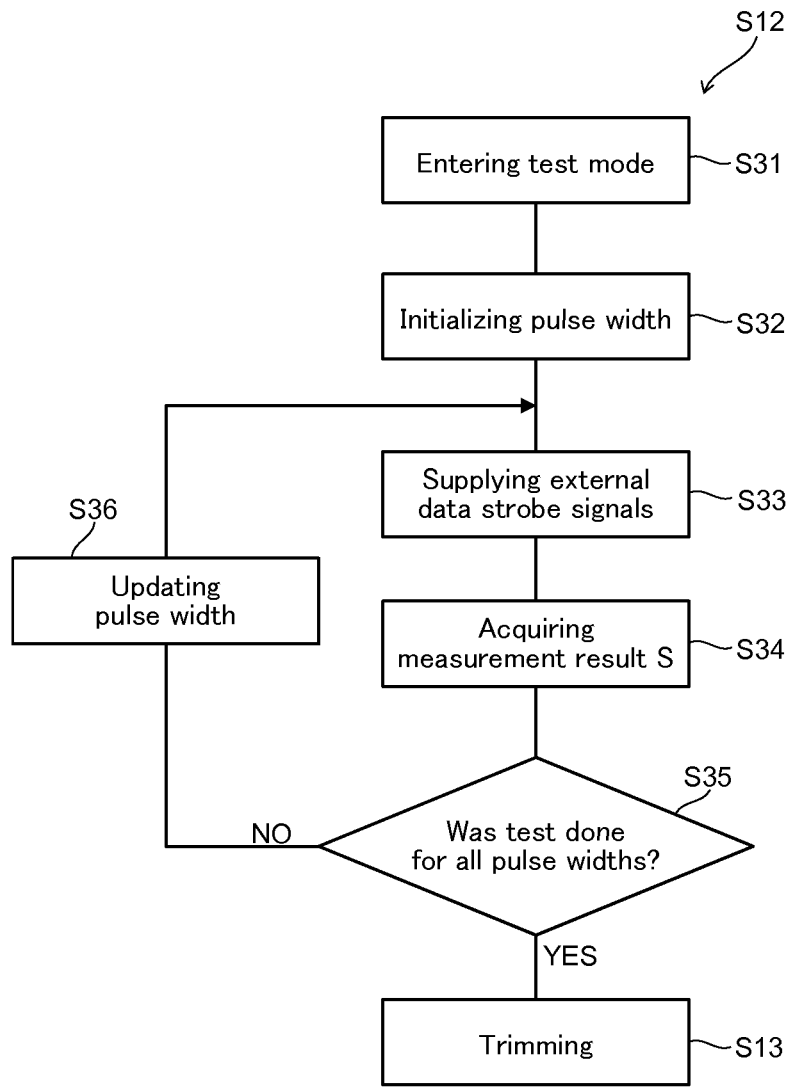
FIG. 17 is a flowchart for explaining an operation according to the preferred sixth embodiment of the present invention.

Turning to FIG. 17, first, to a plurality of semiconductor devices 10 to be tested, a test command is issued via the command address terminals 12a, thereby making the semiconductor devices 10 enter a predetermined test mode (Step S31). After entering the test mode, from the mode register 54 of each semiconductor device 10, a test mode signal TEST is output, thereby bringing about the state where the measurement circuit 200 can measure the propagation time.

Then, in a tester, the pulse width of external data strobe signals DQS and DQSB is set to an initial value (Step S32), and the external data strobe signals DQS and DQSB having the pulse width set are supplied to each semiconductor device 10 (Step S33). The initial value of the pulse width may be a value indicating a maximum pulse width, or a value indicating a minimum pulse width. If the external data strobe signals DQS and DQSB having a predetermined pulse width are supplied to each semiconductor device 10, a high- or low-level measurement result S is obtained. The tester acquires the measurement results S via the data input/output terminals 14, and temporarily stores the measurement results S in a work memory inside the tester (Step S34). As described above with reference to FIGS. 15 and 16, if the measurement result S is at a high level, the pulse width of the internal data strobe signals IDQS and IDQSB is longer than the amount of delay by the replica circuits 210 to 240. If the measurement result S is at a low level, the pulse width of the internal data strobe signals IDQS and IDQSB is shorter than the amount of delay by the replica circuits 210 to 240.

The pulse width becomes updated as the above operation is repeatedly performed (Steps S33 to 36). For example, if the pulse width set at step S32 is a maximum pulse width, the pulse width is gradually decreased at a rate of one pitch at step S36. In this case, the measurement result S obtained at first is expected to be at a high level. Then, after the pulse width is reduced and becomes lower than a predetermined pulse width, the measurement result S obtained afterward is changed to a low level. In this case, the pulse width immediately before the measurement result S is changed from a high level to a low level corresponds to the propagation time of the internal clock signal. After the test with all the pulse widths is completed (YES: Step S35), trimming is performed on the basis of the propagation time of the internal clock signal that is obtained by measurement (Step S13).

In that manner, according to the present embodiment, the measurement is performed by changing the pulse width of the internal data strobe signals IDQS and IDQSB, instead of changing the amount of delay by the measurement circuit 200. Therefore, the circuit configuration of the measurement circuit 200 can be simplified.

It is apparent that the present invention is not limited to the above embodiments, but may be modified and changed without departing from the scope and spirit of the invention.

For example, in each of the above embodiments, the external data strobe signals DQS and DQSB are used as test signals. However, the test signals that are supplied to the measurement circuit 200 are not limited to the external data strobe signals DQS and DQSB; other signals may be used. The test signals that are supplied to the measurement circuit 200 are not necessarily supplied from outside. A signal that is generated inside may be used as a test signal.

What is claimed is:

1. A semiconductor device comprising:
   a measurement circuit measuring propagation time of an internal clock signal inside the semiconductor device;
   a delay adjustment circuit adjusting the propagation time of the internal clock signal; and
   a data output circuit outputting a data signal in response to the internal clock signal,
   wherein the measurement circuit includes a replica circuit of a propagation path of the internal clock signal, the measurement circuit measuring the propagation time of the internal clock signal by measuring a time from when a test signal that is different from the internal clock signal is supplied to the replica circuit until when the test signal is output from the replica circuit, and
   wherein the measurement circuit further includes a latch circuit that latches the test signal output from the replica circuit at a time when the test signal supplied to the replica circuit is changed from a second logic level to a first logic level after the test signal output from the replica circuit is changed from the first logic level to the second look level.

2. The semiconductor device as claimed in claim 1, wherein the time from when the test signal is supplied to the replica circuit until when the test signal is output from the replica circuit is longer than the propagation time of the internal clock signal.

3. The semiconductor device as claimed in claim 1, wherein the measurement circuit further includes:

a counter circuit outputting a different count value each time the test signal is changed from the first logic level to the second logic level; and
   a register circuit storing the count value depending on a logic level of the test signal latched in the latch circuit.

4. The semiconductor device as claimed in claim 3, wherein the data output circuit is configured to be able to output the count value stored in the register circuit to outside.

5. The semiconductor device as claimed in claim 1, further comprising a storage circuit in which a delay code is stored based on a result of measurement by the measurement circuit,
   wherein the delay adjustment circuit adjusts the propagation time of the internal clock signal based on the delay code stored in the storage circuit.

6. The semiconductor device as claimed in claim 5, wherein the storage circuit includes a nonvolatile storage element to which the delay code can be electrically written.

7. The semiconductor device as claimed in claim 5, wherein the data output circuit is configured to be able to output the delay code stored in the storage circuit to outside.

8. The semiconductor device as claimed in claim 1, wherein the data output circuit outputs the data signal in response to the internal clock signal that is not phase-controlled.

9. A semiconductor device comprising:
   first to third external terminals;
   a clock input circuit generating an internal clock signal based on an external clock signal supplied from the first external terminal;
   a data output circuit outputting a data signal to the second external terminal in response to the internal clock signal;
   a delay adjustment circuit provided on a propagation path of the internal clock signal between the clock input circuit and the data output circuit, the delay adjustment circuit adjusting a propagation time of the internal clock signal; and
   a replica circuit receiving a test signal supplied from the third external terminal,
   wherein a first time from when the test signal is supplied to the replica circuit until when the test signal is output from the replica circuit is proportional to a second time from when the external clock signal is supplied to the first external terminal until the internal clock signal reaches the data output circuit.

10. The semiconductor device as claimed in claim 9, wherein the first time is longer than the second time.

11. The semiconductor device as claimed in claim 9, further comprising a strobe circuit outputting a data strobe signal to the third external terminal in synchronism with the data signal output to the second external terminal.

12. A semiconductor device comprising:
    a frequency dividing circuit configured to divide a first clock signal to generate a plurality of second clock signals that are different in phase from one another;
    a multiplier circuit configured to multiply the second clock signals to generate a third clock signal;
    a delay adjustment circuit configured to select a delay amount of the third clock signal based on a delay code to generate a fourth clock signal; and
    a data output circuit outputting a data signal in response to the fourth clock signal.

13. The semiconductor device as claimed in claim 12, further comprising:
    a clock terminal arranged in a first pad region that is provided along a first side of the semiconductor device; and a data terminal arranged in a second pad region that is provided along a second side of the semiconductor device that is opposite to the first side, wherein the first clock signal is supplied from the clock terminal, and the data signal is supplied to the data terminal.

14. The semiconductor device as claimed in claim 13, further comprising:

a first peripheral circuit region provided along the first pad region; and a second peripheral circuit region provided along the second pad region, wherein the frequency dividing circuit is arranged in the first peripheral circuit region, and the multiplier circuit is arranged in the second peripheral circuit region.

15. The semiconductor device as claimed in claim 14, further comprising a memory cell array region arranged between the first and second peripheral circuit regions.

16. The semiconductor device as claimed in claim 12, further comprising a measurement circuit configured to delay a first test signal to output a second test signal, wherein a phase difference between the first and second test signals is proportional to a phase difference between the first and fourth clock signals.

17. The semiconductor device as claimed in claim 16, wherein the phase difference between the first and second test signals is greater than the phase difference between the first and fourth clock signals.

18. The semiconductor device as claimed in claim 16, further comprising:

a data strobe terminal; and a strobe circuit outputting a data strobe signal to the data strobe terminal in synchronism with the data signal, wherein the first test signal is supplied from the data strobe terminal.

* * * * *